United States Patent [19]

Tyson et al.

[11] Patent Number: 5,798,558
[45] Date of Patent: Aug. 25, 1998

[54] MONOLITHIC X-RAY IMAGE DETECTOR AND METHOD OF MANUFACTURING

[75] Inventors: Scott M. Tyson, Albuquerque; Eugene L. Atlas, Carlsbad, both of Calif.

[73] Assignee: Mission Research Corporation, Santa Barbara, Calif.

[21] Appl. No.: 495,239

[22] Filed: Jun. 27, 1995

[51] Int. Cl.$^6$ ............ H01L 31/075; H01L 31/105; H01L 31/117

[52] U.S. Cl. ............ 257/458; 257/444; 257/448; 257/459; 257/724; 257/788

[58] Field of Search ............ 257/724, 443, 257/444, 448, 458, 459, 788

[56] References Cited

U.S. PATENT DOCUMENTS

| | | | |
|---|---|---|---|
| 4,700,076 | 10/1987 | Dorman et al. | 250/370 |
| 4,785,186 | 11/1988 | Street et al. | 250/370.14 |
| 4,810,881 | 3/1989 | Berger et al. | 250/370.01 |
| 4,937,454 | 6/1990 | Itoh et al. | 250/370.11 |
| 5,187,380 | 2/1993 | Michon et al. | 257/428 |
| 5,391,922 | 2/1995 | Matsui | 257/773 |
| 5,543,660 | 8/1996 | Dombroski | 257/707 |
| 5,554,821 | 9/1996 | Patterson et al. | 174/52.2 |

*Primary Examiner*—Ngân V. Ngô
*Attorney, Agent, or Firm*—David O'Reilly

[57] ABSTRACT

An x-ray imaging detector comprised of read-out electronics and PIN diodes formed on a high resistivity silicon-on-insulator substrate that permits cell pitches as small as 20 microns. The read-out electronics are fabricated in the thin, top silicon layer of the SOI substrate. The read-out electronics produced provide circuits such as integrators and transimpedance amplifiers which are required to transform the electrical current from PIN diode detectors into an analog voltage. The anodes of the PIN sensor diodes are formed by etching through an oxide barrier layer in the substrate and implanting a heavily doped p+ region into a high resistivity intrinsic silicon layer. X-ray imaging detectors produced by the methods disclosed herein can be assembled into multi-chip modules that can be used in a large panel x-ray imaging apparatus. With a suitable printed circuit board and an edge connector, these panels, using the x-ray image detectors of the present invention, can provide a form, fit and function replacement of film cassettes in existing x-ray equipment.

12 Claims, 3 Drawing Sheets

MONOLITHIC X-RAY IMAGE DETECTOR AND METHOD OF MANUFACTURING

BACKGROUND OF THE INVENTION

1. Field of the Invention

This invention relates to x-ray imaging technology, and more particularly relates to a monolithic x-ray image detector for use with digital signal image processing.

2. Background Information

Recently there has been great interest in improving diagnostic techniques from x-rays. These efforts include sophisticated image signal processing to improve detection and diagnosis of cancer in patients. In this process, an x-ray image is digitized for processing by computer software. This technology has been developed because the resolution achieved with the present x-ray techniques, is only in the range of 100 to 200 dots per inch (dpi), and is dependent upon exposure and the development process. With digital image signal processing, significant improvements in the early detection diagnosis of cancer has been achieved.

In one application described in *Physics Today*, June 1995, Pages 21 and 22, digital image signal processing has revealed potentially cancerous calcifications that would probably be missed with the usual x-ray techniques. For example, current mammogram techniques only show micro calcifications in the range of 250 microns or greater; smaller tell-tale micro calcifications would be missed or require additional diagnostic procedures to verify. Digital image signal processing combined with current film techniques to digitize a mammogram, has shown promise of detecting micro-calcifications in the range of 50 to 100 microns. Digitizing an image in this matter, to improve detection of a weak signal in a complex background, resulted from signal processing to detect a faint star in a blurry image. This clearly suggests that an enhanced image can greatly improve the results of current imaging techniques.

Present x-ray techniques are also limited by the film to create the images. Not only is the image resolution limited, but large object images are not generally possible. Large scale imaging or full torso x-rays in medical applications as well as large object imaging for industrial applications, is needed.

Another disadvantage of present x-ray techniques is that the application of x-ray depends upon the film sensitivity. Thus, the dosage of x-rays has to be sufficiently high to produce a good, useful image even with currently developed digital image signal processing. Further, digitization of an x-ray image is a difficult and time-consuming process. A higher resolution image than those presently available from x-ray film, that is directly available for digital image signal processing or image construction would be a great advantage.

It is thus, one object of the present invention, to provide an x-ray image detector that will provide higher resolution than x-ray film.

Another object of the present invention is to provide an x-ray image detector that has higher sensitivity than the usual x-ray film permitting a lower dosage of x-rays.

Yet another object of the present invention is to provide an x-ray image detector that includes integrated read-out electronics so that an image is directly available for digital image signal processing.

Still another object of the present invention is to provide a monolithic x-ray image detector that is rugged and can be built into x-ray devices used on-site with portable x-ray equipment.

Still another object of the present invention is to provide a monolithic x-ray image detector comprised of P-type/intrinsic/N-type (PIN) diodes and read-out electronics produced on a high resistance silicon substrate which incorporates dielectric isolation providing three-dimensional integration.

Yet another object of the present invention is to provide x-ray imaging sensors that are constructed from detector elements that allow the die to be very closely abutted to provide edge-to-edge detection capabilities.

Still another object of the present invention is to provide an x-ray image detector having integrated read-out electronics and PIN diodes that permit die to be formed into panels for use in large object imaging.

BRIEF DESCRIPTION OF THE INVENTION

The purpose of the present invention is to provide an x-ray imaging detector that has improved resolution and allows direct access to digital image signal processing technology.

The invention consists of a multi-layer silicon-based structure in which x-ray detectors are fabricated within the same substrate as the read-out electronics, resulting in a monolithic detector structure capable of supporting two dimensional imaging. With the x-ray imaging detectors fabricated according to the present invention, pixel density can be made very high—up to 600 dpi. This pixel density is considerably higher than other approaches which are currently in use or in development, and allow much greater resolution than with current x-ray films. Further, since the detector is monolithic (unlike all other approaches currently in use or development) the device can be easily manufactured in a cost effective manner.

The integration of read-out electronics into the die forming the x-ray imaging detectors, also allows pixel placement out to the die edge unlike chip designs in which input/output (I/O) pads are placed around the die periphery. Since the I/O connection is made on the other side of the die from detector elements, die can be placed very close to one another, allowing the construction of large area x-ray detecting panels. X-ray imaging die, constructed according to the invention, will be approximately 550 mils×550 mils and would contain roughly 100,000 pixels. This corresponds to about 600 dpi, which can be easily mapped into commercial laser printers in order to provide transparent or opaque hard copy output. The individual die can then be tiled into a panel assembly of sensors with adjacent die being very closely abutted by using multi-chip module technology. In this manner, large panels of sensors can be assembled that will be suitable for full torso x-ray imaging in medical applications, and large object imaging in industrial applications.

To produce the large panels, the x-ray image detector die are "flipped" upside down on a layer of Kapton and embedded in plastic. This arrangement will permit very close placement of adjacent die. The plastic is then cured and interconnect metalization is patterned on the read-out side of the x-ray image detector and outputs brought out to metal conductive pads. The multi-chip modules are then assembled onto printed circuit boards using a ball grid array (BGA) technology that allows close positioning and alignment of adjacent multi-chip modules. The resulting panel would be connected to processing electronics through a standard edge connector. The entire large panel assembly can be produced economically and could provide a form, fit and function replacement for film cassettes in existing x-ray equipment.

With the x-ray imaging detector die produced according to the invention, a detector that is highly sensitive, resulting in significant reductions in radiation exposure to people and equipment, can be produced. The x-ray imaging detector has wide application in areas such as: Digital mammography, high resolution chest x-rays, emergency room trauma assessment, intensive care units (ICUs), real-time imaging, materials analysis and evaluation, x-ray astronomy and real-time continuous surgical monitoring applications. The image x-ray detector represents an enabling technology for applications in real-time emergency trauma assessment, three-dimensional breast and tissue imaging (mammotomography), battle field and paramedic applications and large area biomedical imaging such as full body imaging, not presently supported by current film sizes and current film processing requirements. Spectrometry, based upon the energy of incident protons is also possible, thereby enabling accumulation of information not presently possible using film.

The x-ray imaging detectors are produced by simple cost effective manufacturing methods that are fully compatible with industry standard bulk silicon production tools. The detectors use silicon-on-insulator (SOI) substrate fabrication methods to fabricate unique high resistivity substrates in one of two possible ways. The first, and preferred method is a substrate created by using a Bond and Etch-Back Silicon-On-Insulator (BESOI) method. In this method, a first wafer is produced starting with a n+ wafer having a special high resistivity epitaxial silicon layer deposited onto it. The n+ wafer, with the high resistivity epitaxial silicon is then oxidized. A second p− wafer is then oxidized and placed with the oxide surfaces together on the first wafer having the special high resistivity epitaxial silicon. The wafers are then bonded by an oxidation process.

If desired, the p− silicon wafer thickness can be thinned down. Nominal thicknesses range is from 3,000 to 5,000 angstroms, but thicknesses from 500 to 30,000 angstroms can be used. If necessary, the n+ silicon wafer may be thinned to make the wafer conform to conventional wafter thickness or increase the detector's sensitivity to low energy photons if desired. This can be accomplished by one of many techniques, including plasma, chemical etching or mechanical polishing.

Another method of producing a substrate is by Separation by Implantation of Oxygen (SIMOX) in which an n+ wafer first receives a special high resistivity epitaxial silicon as before. An oxygen implant is then performed, typically about 1.6 to $1.8 \times 10^{18}$/cm at about 180 KeV. The oxygen implanted high resistivity epitaxial silicon layer on the n+ wafer is then annealed at about 1,300° to 1,350° C. for six to eight hours. Again, it may be necessary to thin down the total wafer thickness by etching away some of the n+ layer. This can be accomplished by the techniques well known in the art described above.

The methods described above produce a substrate consisting of a highly doped n+ region bottom layer on top of which is formed a high resistivity silicon film. Above this high resistivity film, a layer of buried oxide lies beneath the thin film of silicon on the top surface in which the microelectronics will ultimately be fabricated. The processing then utilizes conventional semiconductor device processing steps and tools to fabricate read-out electronics within the thin film of silicon.

Apertures are then etched through selected areas of the superficial silicon film and the underlying buried oxide barrier layer thereby exposing the top of the high resistivity silicon film. Anodes of the x-ray imaging detectors are then formed by implanting heavily doped p+ regions into the apertures exposing the portion of the high resistivity silicon to form the top of the vertical P-type/intrinsic/N-type (PIN) diode detectors. Standard back end processing is then used to complete the metalization and passivation of the structure. At the conclusion of this processing, the back of the wafer is ground smooth and a thin layer of metal is deposited to complete the electrical connections to the n+ layer of the vertical detectors. This method provides an inexpensive way to mass produce monolithic x-ray imaging detector chips with commercial semiconductor manufacturing techniques and environment.

The x-ray imaging detectors, produced by the method described above, include read-out electronics fabricated in the top thin silicon layer of the SOI substrate. The read-out electronics produce circuits, such as integrators and transimpedance amplifiers, which are required to transform the charge collected from the PIN diode sensors into an analog voltage. The circuitry is fabricated on a pitch of 20 to 40 microns. This would provide an x-ray image detector with considerably greater resolution than the present 100 to 200 dpi resolution of x-ray film, and which depends strongly upon the exposure and developing processes. The x-ray imaging detecting concept of the present invention will produce a three to six times better (9 to 36 times of the area) resolution than with film technology, and will provide data immediately available for image construction, transmission or digital image signal processing. The integrated x-ray image detector/read-out is also considerably more sensitive than present x-ray films, which would result in x-ray doses to the patient being significant reduced.

Another advantage of x-ray image detectors constructed according to the invention, is that the resulting data can be digitized to 12 bits (4096 levels) versus 8 bits (256 levels) available from post processing digitization of x-ray images. Thus the overall x-ray image detector constructed according to the invention can provide significant improvements in x-ray imaging.

The above and other novel features of the invention will be more fully understood from the following detailed description and the accompanying drawings, in which:

DETAILED DESCRIPTION OF THE INVENTION

Figure 1:
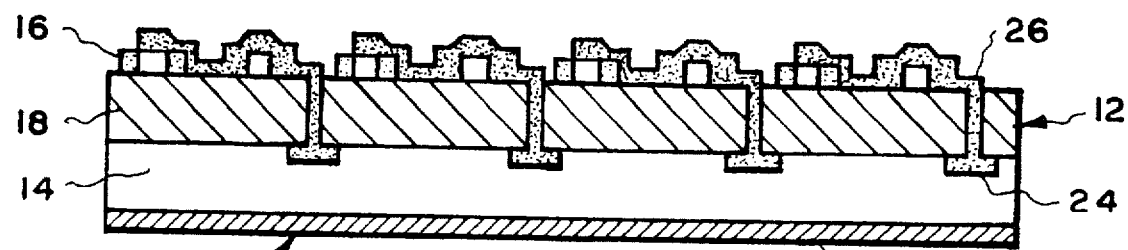
FIG. 1 is a partial cross section illustrating x-ray imaging detector device constructed according to the invention.

An x-ray image detector, constructed according to the invention, is shown in FIG. 1. In the detector shown, the read-out electronics are fabricated within the thin top silicon layer of the SOI substrate. These electronics are configured into circuits such as amplifiers which are required to transform the charge collected from a PIN diode sensor into an analog voltage. X-ray image detectors, constructed according to the invention, can be fabricated on a pitch of 20 to 40 microns. As shown in FIG. 1, an x-ray image detector 10 is fabricated on a substrate 12 which contains a buried dielectric layer 18 such as oxide as will be described in greater detail hereinafter. Substrate 12 is comprised of an intrinsic silicon layer 14 and thin etched silicon layer 16 and an oxide boundary layer or barrier 18.

The vertical diode structure is formed by heavily doped n+ layer 22 on one side of substrate 14, and p+ anode 24 in apertures or cavities 26 etched through oxide barrier 18. Silicided poly or metal contacts 26 are formed on anode 24 of the PIN diode to complete the read-out electronics. Anodes 24 of PIN diodes are formed of heavily doped p+ type silicon regions formed by implantation methods in apertures 26. The x-ray imaging detector dies can be formed to produce as many as 100,000 pixels on a die approximately 550 mils×550 mils. This corresponds to a resolution of about 600 dpi, which is advantageous because it can be easily mapped into commercial laser printers.

Figure 2:
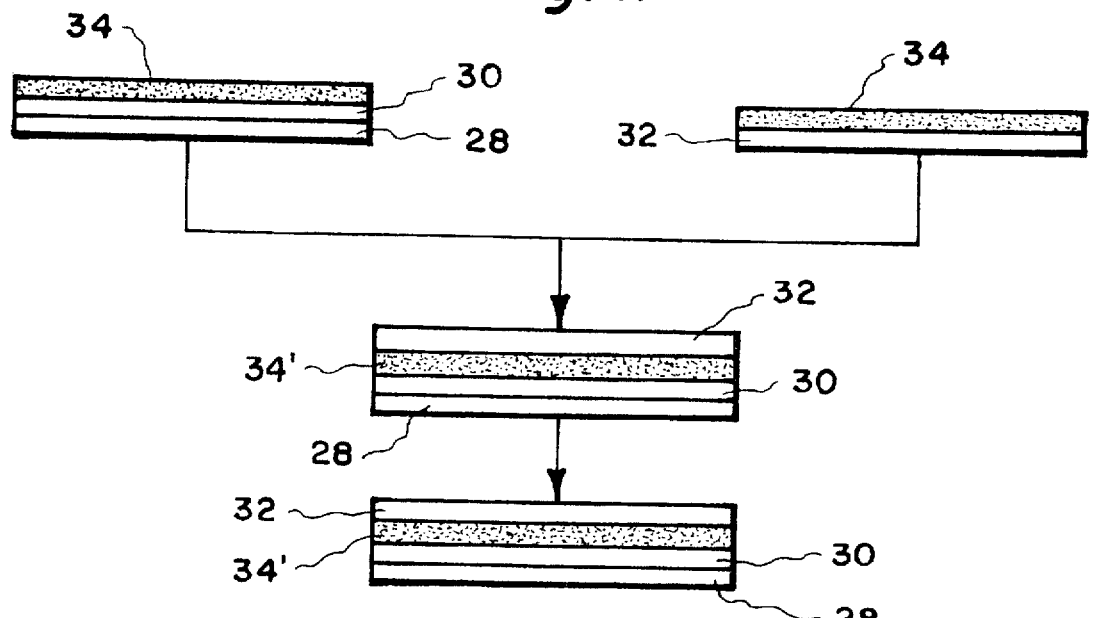
FIG. 2 is a diagram illustrating the fabrication of the novel SOI substrate by a Bond and Etch-Back Silicon-On-Insulator (BESOI) process.

The preferred method of fabricating substrate 12 for the x-ray imaging detector is illustrated in FIG. 2. This method is called a Bond and Etch-back Silicon-On-Insulator method (BESOI). The process begins with an n+ wafer 28, which receives a deposition of special high resistivity epitaxial silicon 30. n+ wafer 28, with the special high resistivity epitaxial silicon 30 is then oxidized producing an oxide layer 34. A second p– wafer 32 is oxidized to also produce an oxide layer 34. The oxide layers 34 on n+ wafer 28 and p– wafer 32 are placed together. The oxide layers 34 on n+ wafer 28 and p– wafer are then bonded by an oxidation process to produce bonded oxide layer 34'. p– silicon wafer 32 is then thinned down to a thickness of the desired value. This can accomplished in several methods known in the art. The best method available is known as "Hughes Accuthin Technique." A nominal thickness is in the range of 3,000 to 5,000 angstroms, but thicknesses of 500 to 30,000 angstroms may be used. It may also be necessary to thin down n+ layer 28 if the total thickness is too great. Thinning of n+ layer 28 can be achieved by many techniques including plasma or chemical etching, or mechanical polishing.

Figure 3:
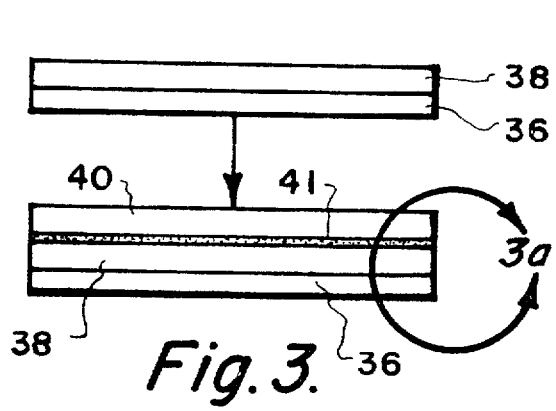
FIGS. 3 and 3a illustrate a method of producing the novel SOI substrate by a Separation by Implantation of Oxygen (SIMOX) fabrication process.
Figure 3A:
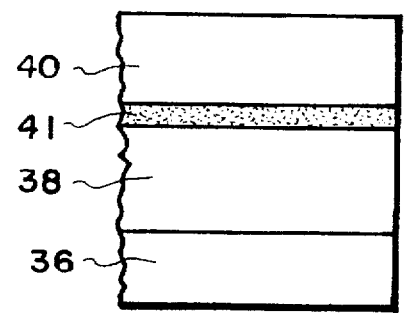

Another method of creating substrate 12 called Separation by Implantation of Oxygen (SIMOX) is illustrated in FIGS. 3 and 3a. This method starts as before, with an n+ wafer 36 receiving a deposition of a special high resistivity epitaxial silicon layer 38. An oxygen implant is then performed; typically 1.6 to $1.8 \times 10^{18}$/cm at about 100 to 180 KeV, forming oxide layer 40. This will result in a construction illustrated in FIG. 3a comprised of an n+ layer 36, high resistivity layer 38 and thin silicon layer 40 separated by oxide barrier layer 41.

Figure 4:
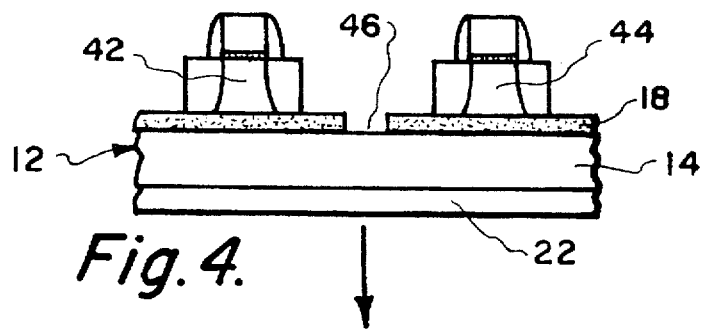
FIGS. 4 through 4a illustrate the method of fabricating detector cells of the integrated x-ray image detector chip of FIG. 1.
Figure 4A:
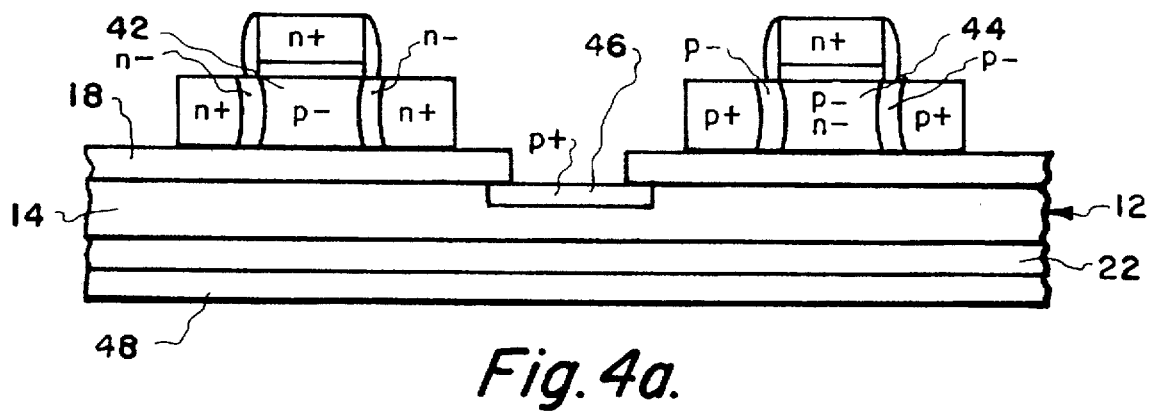

A substrate fabricated according to the methods shown in either FIG. 2 or FIG. 3 is then processed to produce a structure of the type having integrated x-ray imaging detectors or cells, as shown in FIGS. 4 and 4a. The steps listed in the table provided below, describe conventional semiconductor device fabrication plus the steps unique to the invention disclosed herein for forming the PIN diode detectors and mesa isolation.

SEMICONDUCTOR DEVICE FABRICATION

* 1. Initial oxidation (200–400 Å)
2. Nitride deposition (1000–2000 Å)
* 3. Mesa pattern
* 4. Mesa etch (etch nitride/oxide/silicon stack down to buried oxide)
5. Strip photoresist
6. Sidewall oxidation (100–400 Å)
7. Strip nitride
8. Threshold adjust n-channel pattern
* 9. p-well implant
10. Vtn adjust implant
11. Strip photoresist
12. Threshold adjust p-channel pattern
*13. n-well implant
14. Vtp adjust implant
15. Strip Photoresist
16. Polysilicon-1 deposition (4000–5000 Å) (needed for capacitors)
17. Dope poly (POCl3 diffusion or n+ implant/anneal)
18. Deposit capacitor dielectric (re-oxidized nitride or oxide typical) (300–500 Å)
19. Polysilicon-2 deposition (4000–5000 Å)
20. Dope poly (POCl3 diffusion or n+ implant/anneal)
21. Capacitor (polysilicon-2) pattern
22. Etch polysilicon-2
23. Deposit capacitor dielectric (re-oxidized nitride or oxide typical (300–500 Å)
24. Polysilicon-1 pattern
25. Etch capacitor dielectric
26. Etch Polysilicon-1
27. Strip photoresist
*28. Strip oxide
*29. Gate oxidation (50–250 Å)
*30. Polysilicon-3 deposition (4000–5000 Å)
*31. Dope poly (POCl3 diffusion or n+ implant/anneal)
*32. Polysilicon-3 pattern
33. Polysilicon-3 etch
34. Strip photoresist p1 35. Re-oxidation of polysilicon and source/drain regions
36. Detector pattern
37. Detector etch (etch through buried oxide to underlying silicon)
38. Strip photoresist
39. pFET source/drain and detector pattern
40. p-LLD implant (boron, $10^{13}$/cm2)
41. Strip photoresist
42. nFET pattern
43. n-LDD implant (phosphorus or arsenic, $10^{13}$/cm2)
44. Spacer deposition (oxide or nitride, 1500–3000 Å)
45. Spacer etch (RIE anisotropic etch)
*46. pFET source/drain and detector pattern
*47. p+ SD implant (boron, $10^{15-16}$/cm2) and detector implant)
48. strip photoresist
*49. nFET pattern
*50. n+ SD implant (phosphorus or arsenic, $10^{15-16}$/cm2)
51. Implant activation/anneal (850° C., inert, 30 minutes)
52. Oxide strip
53. Titanium deposition (200–1000 Å)
54. Silicide formation (rapid thermal anneal or furnace, 600°–800° C.) to reduce polysilicon and diffusion sheet resistances 55. Interlevel dielectric deposition (may consist of undoped oxide, PSG, BSG, BPSG, TEOS, nitride)
56. Denisification/reflow (diffusion, oxidizing or steam, 800°–1000° C.)
57. Contact pattern and etch
58. Strip Photoresist
59. Metal-1 deposition
60. Metal-1 pattern and etch
61. Strip photoresist
62. Via pattern and etch
63. Strip photoresist
64. Repeat 59–63 for metal-2 and metal-3, if applicable
65. Final passivation
66. Bond pad pattern and etch
67. Strip photoresist The steps above, indicated by an asterisk (*) are unique to forming the x-ray image detector and PIN detectors according to the invention disclosed herein.

The formation of the image detector is briefly shown in the diagrams of FIGS. 4 and 4a. A plurality of mesas 42 and 44, are patterned and etched (steps 3 and 4) and then receive p– well and n+ well implants respectively (steps 9 and 13). Alternatively, mesa pattern and etch steps can be replaced by lateral isolation approach which uses Local Oxidation of Silicon (LOCOS) instead. After annealing, patterning and forming polysilicon gates, detector apertures 46 are then etched through oxide layer or barrier 18 (FIG. 1). p+ SD (source/drain) SD and n+ SD implants are then patterned and performed. Contacts are then provided by patterning, etching and deposition to produce metal contacts 26 connected to PIN diode detectors. Standard back end processing and deposition of a thin layer of metal 48 on the back surface completes the processing.

The pattern, etch and implant steps 35 through 45 of p– LDD (lightly doped drain) and n– LLD, and formation of spacers are optional, but preferred steps in the fabrication of the x-ray imaging detector 10. In the approach described above, the p+ region of the PIN detector is doped by steps 40 and 47. However, the p+ region of the detectors may be doped by a separate and additional p+ implant if desired. This pattern and implant would be best performed after completion of the p+ SD implant, but could be implemented at various points within the process. The above process flow/description creates triple-plate capacitors out of polysilicon layers. There are several other methods for integrating capacitors into the circuit. The description above represents one possible, but preferred approach.

At the conclusion of processing, the back of the x-ray imaging detector fabricator is ground smooth and a thin layer of metal 48 is deposited to complete the electrical connection to the vertical detectors. The method described above provides an inexpensive way to mass produce monolithic x-ray imaging detectors using commercial semiconductor manufacturing tools and environments that produce cell pitches as small as 20 microns. Thus, the x-ray imaging detector can be used in applications that will benefit from fine pitch read-out electronics and pixel densities.

In operation, the x-ray imaging detector absorbs x-rays in intrinsic silicon region 14 (FIG. 1) generating hole-electron pairs which drift and diffuse to PIN diode anodes 24 and cathodes 22 (FIG. 1) respectively. The resulting electrical currents are transformed to analog voltage levels by the read-out cell associated with each anode and routed off the die for analog-to-digital conversion and subsequent signal processing. In essence, the detector performs a real-time conversion of an x-ray exposure into electronic signals that can be addressed pixel-by-pixel. By converting signals to a digital format, they can be read and subjected to sophisticated data analysis and visualization techniques immediately upon exposure to x-rays.

Figure 5:
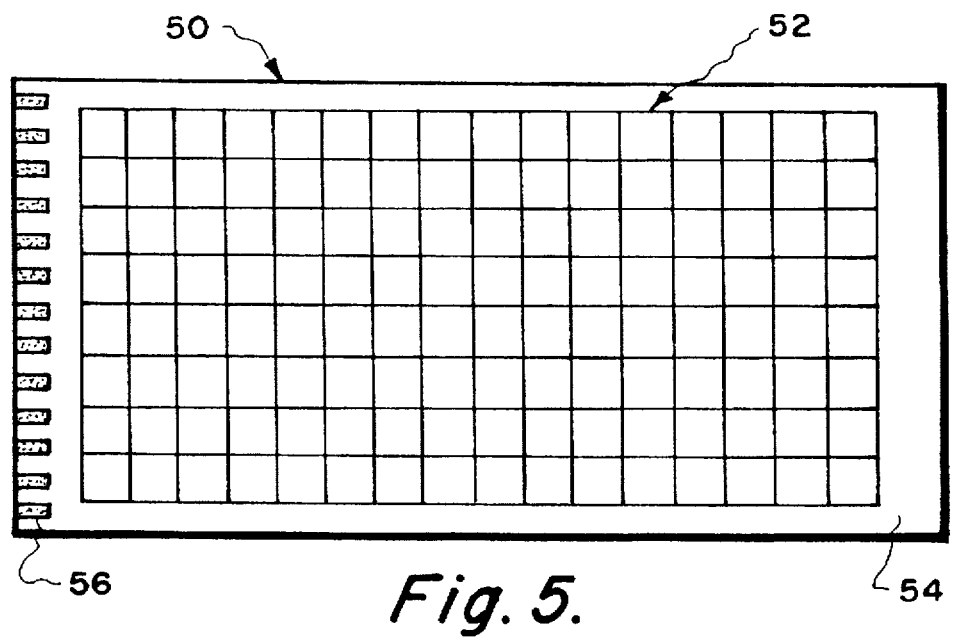
FIGS. 5, 5a and 5b illustrate the x-ray image detector die of the present invention being used to produce a large object x-ray imaging detector panel.
Figure 5A:
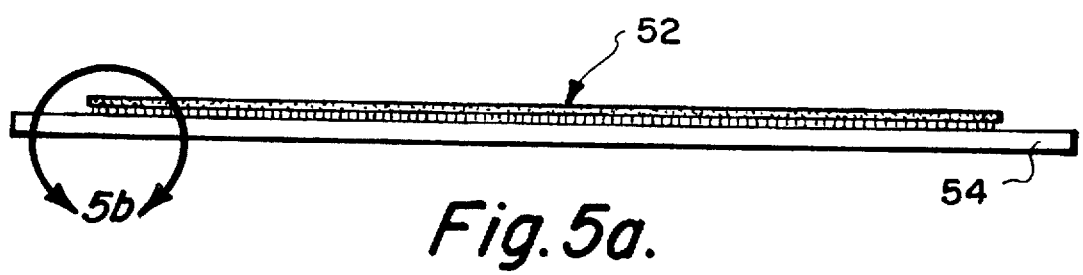
Figure 5B:
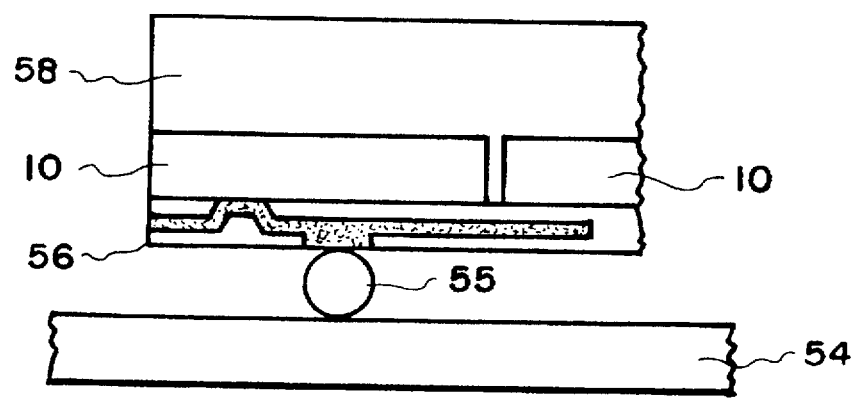

One such application would be the production of an x-ray imaging detector panel assembly that could be used in large object imaging. An x-ray imaging detector panel, constructed in this manner, is illustrated in FIGS. 5 and 5a. An x-ray imaging panel 50 is comprised of an array of x-ray imaging detecting modules 52 mounted on a printed circuit board 54, having a standard edge connector 56. X-ray imaging detecting modules 52 would be constructed using multi-chip module technology and advanced assembly techniques allowing individual x-ray imaging detector die 10 (FIG. 1) to be tiled into panel assembly 50 of detectors with adjacent die very closely abutted. Thus, large panels of x-ray image detecting die 10 can be assembled to permit full torso x-ray imaging in medical applications and large field imaging in industrial applications.

Multi-chip modules 52 will be built using high density interconnect technology such as that available using General Electric (GE) technology. X-ray imaging detector die 10 (FIG. 1) would be "flipped" upside down with the read-out side of the detector on a layer of Kapton and metal die interconnect 56 and embedded in plastic substrate layer 58. This arrangement will permit very close placement of adjacent image detector die 10. Multi-chip modules 52 would be assembled into printed circuit boards with Ball Grid Array (BGA) technology that allows close positioning and alignment of adjacent modules connected by solder ball interfaces 55 to printed circuit board 54. Ball grid array (BGA) assembly is readily available commercially. The resulting panel 50 can be connected to processing electronics through standard edge connector 56. A particular advantage of this system is that it can be produced very economically and could be used to provide a form, fit and function replacement of film cassettes in existing x-ray equipment.

Thus, there has been disclosed a novel x-ray image detector comprised of a high resistivity SOI substrate with integrated read-out electronics and PIN diode detectors. The monolithic detector array disclosed and the method of manufacture allow die to be produced with an edge-to-edge construction so they can be arranged in sensor modules. The x-ray detector or image sensor provides substantial increase in resolution and sensitivity allowing low dosages and the use of digital imaging analysis.

This invention is not to be limited by the embodiment shown in the drawings and described in the description which is given by way of example and not of limitation, but only in accordance with the scope of the appended claims.

What is claimed is:

1. An x-ray imaging apparatus comprising:
   a printed circuit board;
   connecting means connecting said printed circuit board to electronic processing means;
   a plurality of x-ray imaging detectors arranged in a multi-chip module array on said printed circuit board, said multi-chip module array comprising:
      a high resistivity substrate,
      a plurality of PIN diodes formed in said substrates,
      electronic read-out means formed on said substrate in which PIN diode detectors have been fabricated which transforms the charge collected by each PIN diode into an analog voltage,
   interconnecting means interconnecting said multi-chip module array;

a plastic substrate covering and encapsulating said multi-chip module array;

whereby said multi-chip module array forms a large x-ray image detecting panel.

2. The apparatus according to claim 1 in which said multi-chip module array comprises said plurality of x-ray imaging detectors in edge-to-edge abutment.

3. The apparatus according to claim 2 in which said interconnecting means includes a Kapton and metal die interconnect.

4. The apparatus according to claim 3 in which said multi-chip module array are assembled in said printed circuit board in a ball grid array.

5. The apparatus according to claim 4 including a solder ball interface connecting said multi-chip module array to said printed circuit board.

6. The apparatus according to claim 1 in which said connecting means comprises an edge connector on said printed circuit board.

7. The detector according to claim 1 in which said PIN diodes comprise; at least one n+ cathode formed on a surface of said high resistivity substrate; and a plurality of heavily doped p+ implanted regions in said substrate forming anodes associated with said n+ cathode.

8. The detector according to claim 7 in which said substrate includes an oxide layer; said p+ implants being implanted in apertures etched through said oxide layer in said substrate.

9. The detector according to claim 8 in which said high resistivity substrate comprises a high resistivity epitaxial silicon layer having an oxide barrier layer.

10. The detector according to claim 9 in which said substrate includes an oxide layer on a p-wafer bonded to the oxide layer on said high resistivity epitaxial layer.

11. The detector according to claim 9 in which said oxidized barrier layer comprises a first oxide layer formed on said high resistivity epitaxial layer, a second oxide layer formed on a p– wafer; said first and second oxide layers being placed together and bonded by an oxidation process.

12. The detector according to claim 11 in which said substrate has a nominal thickness in the range of 3,000 to 5,000 angstroms.

* * * * *